United States Patent
Wong et al.

(10) Patent No.: US 10,389,163 B2
(45) Date of Patent: Aug. 20, 2019

(54) ENHANCED REVERSE BOOSTING DETECTION IN A WIRELESS CHARGING SCHEME

(71) Applicant: QUALCOMM Incorporated, San Diego, CA (US)

(72) Inventors: David Wong, Santa Clara, CA (US); Neal Horovitz, Los Altos, CA (US); Ta-Tung Yen, Santa Clara, CA (US); Sanghwa Jung, Los Gatos, CA (US); Cheong Kun, San Diego, CA (US); Kin Siu Fung, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 92 days.

(21) Appl. No.: 15/789,663

(22) Filed: Oct. 20, 2017

(65) Prior Publication Data
US 2019/0120905 A1   Apr. 25, 2019

(51) Int. Cl.
| | | |
|---|---|---|
| H02J 7/00 | (2006.01) | |
| H02J 7/02 | (2016.01) | |
| H02J 50/10 | (2016.01) | |
| G01R 31/382 | (2019.01) | |
| H02J 7/04 | (2006.01) | |
| H03K 5/24 | (2006.01) | |
| H02M 3/158 | (2006.01) | |
| G01R 31/36 | (2019.01) | |

(52) U.S. Cl.
CPC ............ *H02J 7/025* (2013.01); *G01R 31/382* (2019.01); *H02J 7/04* (2013.01); *H02J 50/10* (2016.02); *H02M 3/158* (2013.01); *H03K 5/24* (2013.01); *G01R 31/3648* (2013.01)

(58) Field of Classification Search
CPC ... H02J 7/025; H02J 7/04; H02J 50/10; G01R 31/382; G01R 31/3648; H03K 5/24; H02M 3/158
See application file for complete search history.

(56) References Cited

U.S. PATENT DOCUMENTS

| | | | | |
|---|---|---|---|---|
| 6,396,252 B1 * | 5/2002 | Culpepper | ............ | H02M 3/156 323/225 |
| 6,940,189 B2 * | 9/2005 | Gizara | ..................... | H02M 3/00 257/E25.029 |

(Continued)

FOREIGN PATENT DOCUMENTS

WO    2017039917 A1    3/2017

OTHER PUBLICATIONS

International Search Report and Written Opinion—PCT/US2018/052779—ISA/EPO—dated Nov. 15, 2018.

*Primary Examiner* — Naum Levin
(74) *Attorney, Agent, or Firm* — Qualcomm Incorporated

(57) ABSTRACT

Enhanced reverse boosting detection in a wireless charging scheme is disclosed. In some implementations, a minimum mid-level input voltage regulation (VMID_MIN regulation) loop is provided to regulate an input voltage from a wirelessly coupled power source when a mid-level of the input voltage falls below a predetermined threshold. The input voltage is provided to a buck converter within a wireless charging receiver. An input missing poller signal generator is provided to generate an input missing poller (IMP) signal if the VMID_MIN regulation loop becomes active and the buck converter has entered a discontinuous mode.

17 Claims, 5 Drawing Sheets

(56) References Cited

U.S. PATENT DOCUMENTS

| | | | |
|---|---|---|---|
| 7,696,739 B2* | 4/2010 | Bacchi | H02M 3/156 |
| | | | 323/283 |
| 7,872,456 B2* | 1/2011 | Li | H02M 3/1588 |
| | | | 323/224 |
| 9,118,193 B2* | 8/2015 | Yeh | H02J 7/0029 |
| 9,219,372 B2* | 12/2015 | Paparrizos | H02M 3/1582 |
| 9,257,908 B2 | 2/2016 | Thompson et al. | |
| 9,425,631 B2* | 8/2016 | Furtner | G06F 1/263 |
| 9,601,936 B2* | 3/2017 | Goncalves | H02J 7/0029 |
| 9,748,774 B2* | 8/2017 | Van Den Brink | H02J 5/005 |
| 9,755,514 B2* | 9/2017 | Pullen | H02M 3/158 |
| 9,853,460 B2* | 12/2017 | Ichikawa | H02M 3/1582 |
| 9,935,470 B2* | 4/2018 | Pagano | H02J 50/80 |
| 9,972,998 B2* | 5/2018 | Bisogno | H02H 9/02 |
| 10,186,891 B2* | 1/2019 | Baby | H02J 7/0093 |
| 2004/0155625 A1* | 8/2004 | Floyd | B60R 25/021 |
| | | | 320/104 |
| 2010/0148737 A1* | 6/2010 | Li | H02M 3/1588 |
| | | | 323/282 |
| 2012/0155136 A1 | 6/2012 | Von Novak et al. | |
| 2014/0210400 A1* | 7/2014 | Goncalves | H02J 7/0029 |
| | | | 320/107 |
| 2014/0210433 A1 | 7/2014 | Rutkowski et al. | |
| 2015/0002115 A1* | 1/2015 | Shenoy | H02M 3/158 |
| | | | 323/271 |
| 2015/0042298 A1 | 2/2015 | Kung et al. | |
| 2015/0244176 A1* | 8/2015 | Van Den Brink | H02J 5/005 |
| | | | 307/104 |
| 2016/0072312 A1* | 3/2016 | Ichikawa | H02M 3/1582 |
| | | | 307/104 |
| 2016/0359322 A1* | 12/2016 | Kim | H02J 1/00 |
| 2017/0047840 A1 | 2/2017 | Campos | |
| 2017/0077734 A1* | 3/2017 | Nokkonen | H02J 7/025 |
| 2017/0117717 A1* | 4/2017 | Pagano | H02J 50/80 |
| 2017/0222464 A1 | 8/2017 | Pullen et al. | |
| 2017/0271924 A1* | 9/2017 | Mao | H02J 50/80 |
| 2018/0090945 A1* | 3/2018 | Langlinais | H02J 7/007 |
| 2018/0316225 A1* | 11/2018 | Yeo | H02J 50/12 |

* cited by examiner ced reverse
ENHANCED REVERSE BOOSTING DETECTION IN A WIRELESS CHARGING SCHEME

FIELD OF DISCLOSURE

Aspects of the present disclosure relate generally to wireless charging, and more particularly to enhanced reverse boosting detection in a wireless charging scheme.

BACKGROUND

In a portable device, a battery charger is commonly provided to charge a battery within the portable device. A battery charger that uses a switch-mode architecture can boost an output voltage at an output node, where a battery or other power supplying device is currently connected to, back to an input node when an input power supply is removed from the input node. This is referred to as reverse boosting. The battery charger may stay stuck in this undesirable state because it cannot distinguish that the input power supply has been removed. One typical approach to detect reverse boosting is to monitor an input voltage and an input current to the battery charger. However, for wireless charging, this approach may not work because of a lack of input current.

SUMMARY OF THE DISCLOSURE

The following presents a simplified summary of one or more implementations to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

Implementations of the present invention relate to an error amplifier in power management integrated circuit (PMIC). Such an error amplifier may comprise a minimum mid-level input voltage regulation (VMID_MIN regulation) loop to regulate an input voltage from a wirelessly coupled power source when a mid-level of the input voltage falls below a predetermined threshold, the input voltage being provided to a buck converter within a wireless charging receiver. The error amplifier further comprises an input missing poller signal generator to generate an input missing poller (IMP) signal if the VMID_MIN regulation loop becomes active and the buck converter has entered a discontinuous mode.

In some implementations, the error amplifier further comprises a low side power transistor current zero crossing detector to monitor if a current of a low side power transistor within the buck converter has fallen below zero. The buck converter has entered the discontinuous mode if the current of the low side power transistor has fallen below zero.

In some implementations, the error amplifier further comprises a skip mode comparator to generate a skip mode signal indicative of the buck converter being in a skip mode. The buck converter has entered the discontinuous mode if the skip mode signal is asserted.

In some implementations, the input voltage is wirelessly received via a wireless power coil inductively couple to a wireless charging pad. The wireless charging receiver may be a Qi wireless charging receiver or a Power Matters Alliance (PMA) wireless charging receiver.

Implementations may also include a method for detecting reverse boosting. The method comprises determining if a minimum mid-level input voltage regulation (VMID_MIN regulation) loop within a power management integrated circuit (PMIC) is active, wherein the PMIC is configured to control a wireless charging receiver. If the VMID_MIN regulation loop is active, the method further comprises determining if a buck converter within the wireless charging receiver is in a discontinuous mode. The method further comprises generating an input missing poller (IMP) trigger signal if the VMID_MIN regulation loop is active and the buck converter is in the discontinuous mode.

In some implementations, determining if the buck converter within the wireless charging receiver is in the discontinuous mode comprises detecting if a current through a low side power transistor of the buck converter has fallen below zero. Determining if the buck converter is in the discontinuous mode may further comprise detecting if an output voltage of the VMID_MIN regulation loop falls below a skip_mode reference voltage.

Additional implementations relate to a portable device. The portable device comprises a wireless charging receiver comprising a buck converter. The portable device further comprises a power management integrated circuit (PMIC) coupled to the wireless charging receiver. The PMIC may include a buck converter controller. The buck converter controller can have an error amplifier. The error amplifier can include a minimum mid-level input voltage regulation (VMID_MIN regulation) loop to regulate an input voltage from a wirelessly coupled power source when a mid-level of the input voltage falls below a predetermined threshold, the input voltage being provided to the buck converter. The error amplifier may further comprise an input missing poller signal generator to generate an input missing poller (IMP) signal if the VMID_MIN regulation loop becomes active and the buck converter has entered a discontinuous mode.

In some implementations, the portable device includes a low side power transistor current zero crossing detector to monitor if a current of a low side power transistor within the buck converter has fallen below zero. The buck converter has entered the discontinuous mode if the current of the low side power transistor within the buck converter has fallen below zero.

In some implementations, the portable device includes a skip mode comparator to generate a skip mode signal indicative of the buck converter being in a skip mode. The buck converter has entered the discontinuous mode if the skip mode signal is asserted.

In some implementations, the portable device comprises a wireless power coil configured to inductively couple to a wireless charging pad to receive the input voltage wirelessly. The wireless charging receiver can be a Qi wireless charging receiver or a Power Matters Alliance (PMA) wireless charging receiver.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various implementations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form to avoid obscuring such concepts. Acronyms and other descriptive terminology may be used merely for convenience and clarity and are not intended to limit any concept disclosed herein.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of the element. Rather, the designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Figure 1:
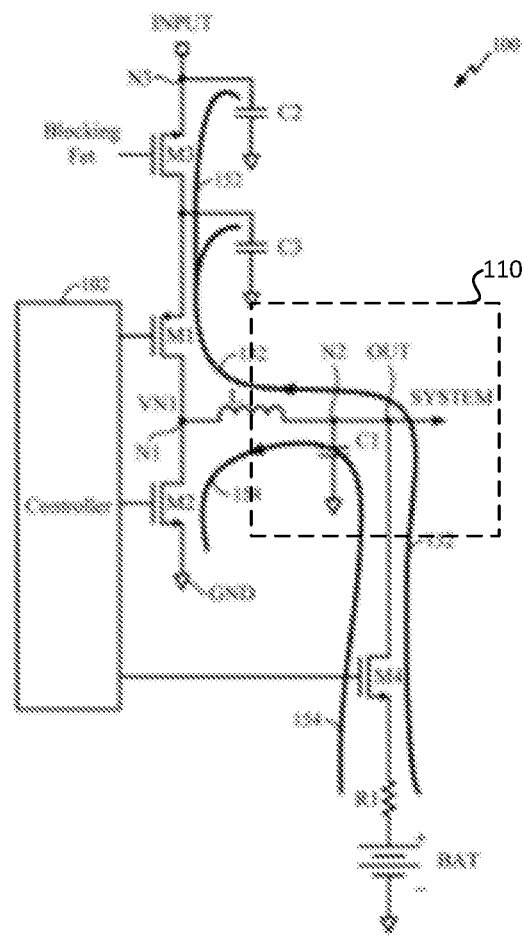
FIG. 1 illustrates one implementation of a switch-mode battery charger.

FIG. 1 illustrates one implementation of a switch-mode battery charger. Such switch-mode battery charger can be used to charge batteries within a portable device, such as a smartphone, a smart watch, a laptop, etc. Switch-mode battery charger 100 includes a buck converter 110 and a controller (a.k.a. a buck controller) 102. As shown in FIG. 1, buck converter 110 includes a high-side power switch M1, a low-side power switch M2, an inductor L, and an output capacitor C1. Buck controller 102 is coupled to each of high-side power switch M1 and low-side power switch M2. More specifically, buck controller 102 may be coupled to a gate of high-side power switch M1 and a gate of low-side power switch M1. Each of a drain of high-side power switch M1 and a drain of low-side power switch M2 may be coupled to a node N1, which may be coupled to inductor L. A source of low-side power switch M2 may be coupled to ground. Inductor L may be further coupled to a node N2, which is further coupled to an output port OUT. Output capacitor C1 is coupled between node N2 and ground.

Additionally, switch-mode battery charger 100 includes a blocking switch M3. A source of blocking switch M3 may be coupled to an input node (a.k.a., an input port) N3, which is further coupled to ground via a capacitor C2. A drain of blocking switch M3 may be coupled to a source of high-side power switch M1 and a capacitor C3, which is further coupled to ground. Switch-mode battery charger 100 may also include a battery switch M4 having a gate coupled to buck controller 102 and a drain coupled to output port OUT. Battery switch M4 further includes a source coupled to a battery BAT via a resistor R1. It is noted that resistor R1 may include a battery pack resistance, which is a resistance internal to battery BAT. Battery BAT may be coupled between resistor R1 and ground. Battery BAT is merely one example of internal power storage. The term "battery" may refer to a single cell configuration or a multiple cell stack configuration (e.g., a 2S configuration, which comprises 2 series-connected cells). When power collapse occurs (e.g., an external power source removed from the battery charger 100), reverse boosting in buck converter 110 can happen.

FIG. 1 further illustrates inductor currents of switch-mode battery charger 100 during reverse-boosting. With reference to switch-mode battery charger 100, during a first mode of a reverse-boosting operation (e.g., while high-side power switch M1 is in a conductive state and low-side power switch M2 is non-conductive state), an inductor current, as indicated by reference numeral 152 in FIG. 1, may flow from battery BAT to capacitors C2 and C3 via high-side power switch M1.

During a second mode of a reverse-boosting operation (e.g., while high-side power switch M1 is in a non-conductive state and low-side power switch M2 is a conductive state), an inductor current, as indicated by reference numeral 154, may flow from battery BAT to ground via low-side power switch M2. As reverse boosting continues, battery BAT may eventually be discharged.

One typical way to detect reverse boosting upon removal of an input power supply in wired or plugged-in charging is to monitor the input voltage and an input current of the switch-mode battery charger 100. If the input voltage and the input current fall below their respective threshold values, then it can be inferred that reverse boosting is happening. An "input missing poller" (IMP) algorithm may be initiated to stop reverse boosting, thus stopping the internal power storage devices, such as battery BAT, from further discharging. However, in the case of wireless charging, because the device being charged is not physically connected to the power source, there is no input current to the switch-mode charger 100. Thus, there is a need to provide another way to detect or to infer reverse boosting in wireless charging schemes.

Figure 2:
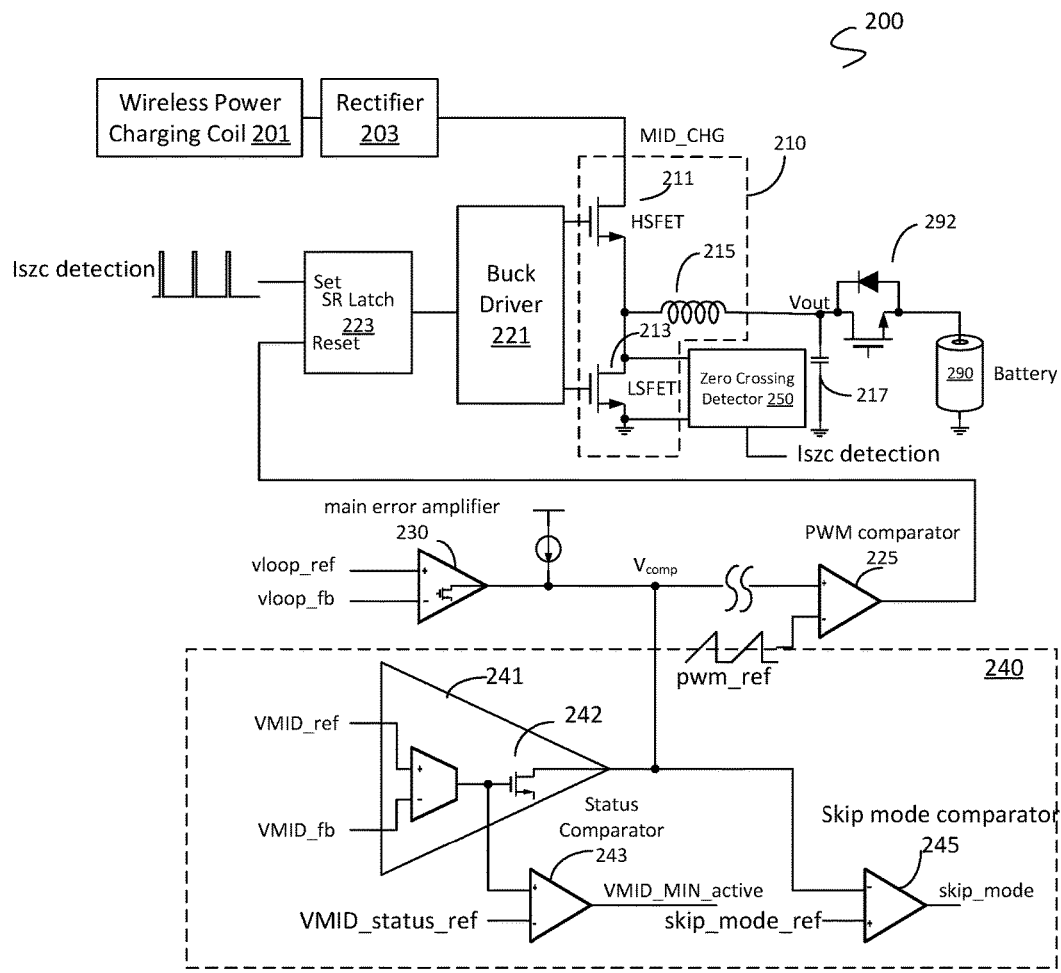
FIG. 2 illustrates one implementation of a wireless charging scheme with enhanced reverse boosting detection.

FIG. 2 illustrates one implementation of a wireless charging scheme with enhanced reverse boosting detection. Such a scheme can be used in a portable device (e.g., smartphone, smart watch, etc.) that is wirelessly chargeable. The portable device may be compliant with Qi wireless charging standard and/or Power Matters Alliance (PMA) wireless charging standard, for example. The scheme 200 illustrated includes a wireless power charging coil 201, a rectifier 203, a buck converter 210, a buck driver 221, a set-reset (SR) latch 223, a pulse-width modulation (PWM) comparator 225, a main error amplifier 230, a minimum mid-level input voltage regulation (VMID_MIN regulation) loop 240, a zero crossing detector 250, a battery switch 292, and a battery 290. The buck converter 210 includes a high-side power switch 211, a low-side power switch 213, an inductor 215, and an output capacitor 217. High-side power switch 211 and low-side power switch 213 are coupled in series between ground and an output of rectifier 203 (labeled as "MID_CHG" in FIG. 2). A first terminal of inductor 215 is coupled to the drain of high-side power switch 211 and the source of low-side power switch 213, while a second terminal of inductor 215 is coupled to output capacitor 217. Buck converter 210 outputs an output voltage $V_{out}$ at the second terminal of inductor 215. The second terminal of inductor 215 is further coupled to battery switch 292. Battery 290 is coupled between battery switch 292 and ground. Zero crossing detector 250 is coupled to low-side power switch 213 to detect when the current through low-side power switch 213 has fallen below zero (a.k.a., zero crossing). Zero crossing detector 250 outputs a signal, Iszc detection, to indicate zero crossing has occurred.

When wireless power charging coil 201 receives an input voltage inductively from a power source (not shown), wireless power charging coil 201 supplies an input voltage to rectifier 203, which rectifies the input voltage and then outputs the rectified input voltage to buck converter 210.

In some implementations, buck converter 210 is controlled by buck driver 221, SR latch 223, PWM comparator 225, and main error amplifier 230, in operation with each other. As illustrated in FIG. 2, main error amplifier 230 has an output $V_{comp}$ coupled to a positive input of PWM comparator 225. An output of PWM comparator 225 is coupled to a Reset input of SR latch 223. An output of SR latch 223 is coupled to an input of buck driver 221, which has one output coupled to a gate of high-side power switch 211 and a second output coupled to a gate of low-side power switch 213. In operation, main error amplifier 230 receives a reference voltage vloop_ref and a feedback voltage vloop_fb, where vloop_fb can be $V_{out}$ or a voltage proportional to $V_{out}$. Based on the difference between vloop_fb and vloop_ref, main error amplifier 230 outputs $V_{comp}$, which is subsequently input to PWM comparator 225. Based on Vcomp and a reference signal, pwm_ref, PWM comparator 225 outputs a signal to the Reset input terminal of SR latch 223. SR latch 223 further includes a Set input terminal to receive Iszc detection. SR latch 223 outputs a pulse-width modulated signal to buck driver 221 to cause buck driver 221 to drive the gates of high-side power switch 211 and low-side power switch 213 with signals having the appropriate duty cycle.

As discussed above with reference to FIG. 1, reverse boosting of buck converter 210 may occur in the event of a power collapse, which can be caused by the removal of the power source. When reverse boosting is detected, an input poller missing (IMP) algorithm is initiated to stop reverse boosting of buck converter 210 preventing unnecessary discharge of battery 290. In many wireless charging schemes, such as charging scheme 200 illustrated in FIG. 2, there is no switch between buck converter 210 and rectifier 203, and hence, there is no input current to monitor for detection of reverse boosting. Thus, power collapse has to be detected or inferred from other signals in charging scheme 200. In some implementations, signals generated in VMID_MIN regulation loop 240, which is provided to regulate input voltage, are leveraged for detection of reverse boosting.

As shown in FIG. 2, VMID_MIN regulation loop 240 includes an error amplifier 241, a status comparator 243, and a skip mode comparator 245. In some implementations, error amplifier 241 receives a reference voltage (VMID_ref) and a feedback voltage proportional to a mid-level of the input voltage (VMID_fb). The output of error amplifier 241 is coupled to the output of main error amplifier 230 ($V_{comp}$). Error amplifier 241 has an output transistor 242, which outputs $V_{comp}$ at its source terminal. VMID_MIN regulation loop 240 lowers the duty cycle of $V_{comp}$ if VMID_fb falls below the VMID_ref. However, lowering the duty cycle of $V_{comp}$ might enhance reverse boosting. Therefore, additional internal signals of the VMID_MIN regulation loop 240 are monitored to determine if reverse boosting has begun.

In some implementations, the status of VMID_MIN regulation loop 240 is monitored for detection of reverse boosting. Specifically, a gate terminal of output transistor 242 in error amplifier 241 is coupled to a positive input terminal of status comparator 243. A negative input terminal of status comparator 243 receives a reference voltage, VMID_status_ref. In some implementations, VMID_status_ref is about 0.3V. Based on a comparison of the gate voltage of output transistor 242 and VMID_status_ref, status comparator 243 outputs a signal VMID_MIN_active to indicate whether VMID_MIN regulation loop 240 is active. VMID_MIN regulation loop 240 is active when VMID_MIN regulation loop 240 starts regulating the input voltage. In some implementations, VMID_MIN regulation loop 240 starts regulating the input voltage when a mid-level of the input voltage falls below a predetermined threshold.

When VMID_MIN regulation loop 240 becomes active, as indicated by the assertion of VMID_MIN_active, it can be inferred that reverse boosting is occurring if buck converter 210 has entered a discontinuous mode. In general, buck converter 210 has entered the discontinuous mode if at least one of two conditions is met. The first condition is zero crossing at low-side power switch 213. The second condition is that buck converter 210 has entered a skip mode. Both conditions are further discussed below.

To detect if zero crossing at low-side power switch 213 has occurred, Iszc detection is monitored. As discussed above, the Iszc detection signal indicates whether the current through low-side power switch 213 of buck converter 210 has fallen below zero (i.e., zero crossing has occurred). To avoid mistakenly treating a transient event that causes a temporarily negative current through low side power switch 213 as reverse boosting caused by removal of the external power source, zero crossing detector 250 includes a counter, which is triggered if an Iszc detection pulse occurs over a predetermined number of times (e.g., 60) within a certain time period (e.g., 12 clock cycles). Therefore, in some implementations, when the VMID_MIN regulation loop 240 becomes active, the zero crossing detector 250 monitors the Iszc detection pulse. If the number of the Iszc detection pulses reaches the predetermined limit, then it is inferred that zero crossing has occurred and hence, an IMP trigger signal is sent to a digital core (not shown) of power management integrated circuit (PMIC) of the portable device to initiate the IMP algorithm to stop reverse boosting. In other words, zero crossing detector 250 pre-qualifies the event before initiating the IMP algorithm.

In addition to, or in alternative to, zero crossing, the second condition that can trigger the IMP algorithm is buck converter 210 entering skip mode while VMID_MIN regulation loop 240 is active. In skip mode, buck converter 210 can skip a pulse width modulated (PWM) cycle in response to the output of PWM comparator 225. Thus, to detect if buck converter 210 has entered skip mode, the positive input to PWM comparator 225, $V_{comp}$, is compared against a skip mode reference voltage, skip_mode_ref using skip mode comparator 245. In some implementations, skip_mode_ref is about 100 mV. The output of skip mode comparator 245, skip_mode, is asserted if $V_{comp}$ drops below skip_mode ref, indicating that buck converter 210 has entered skip mode. Therefore, if VMID_MIN regulation loop 240 is active and skip_mode is asserted, the IMP trigger signal is sent to the digital core (not shown) of PMIC in the portable device to initiate the IMP algorithm to stop reverse boosting.

Figure 3:
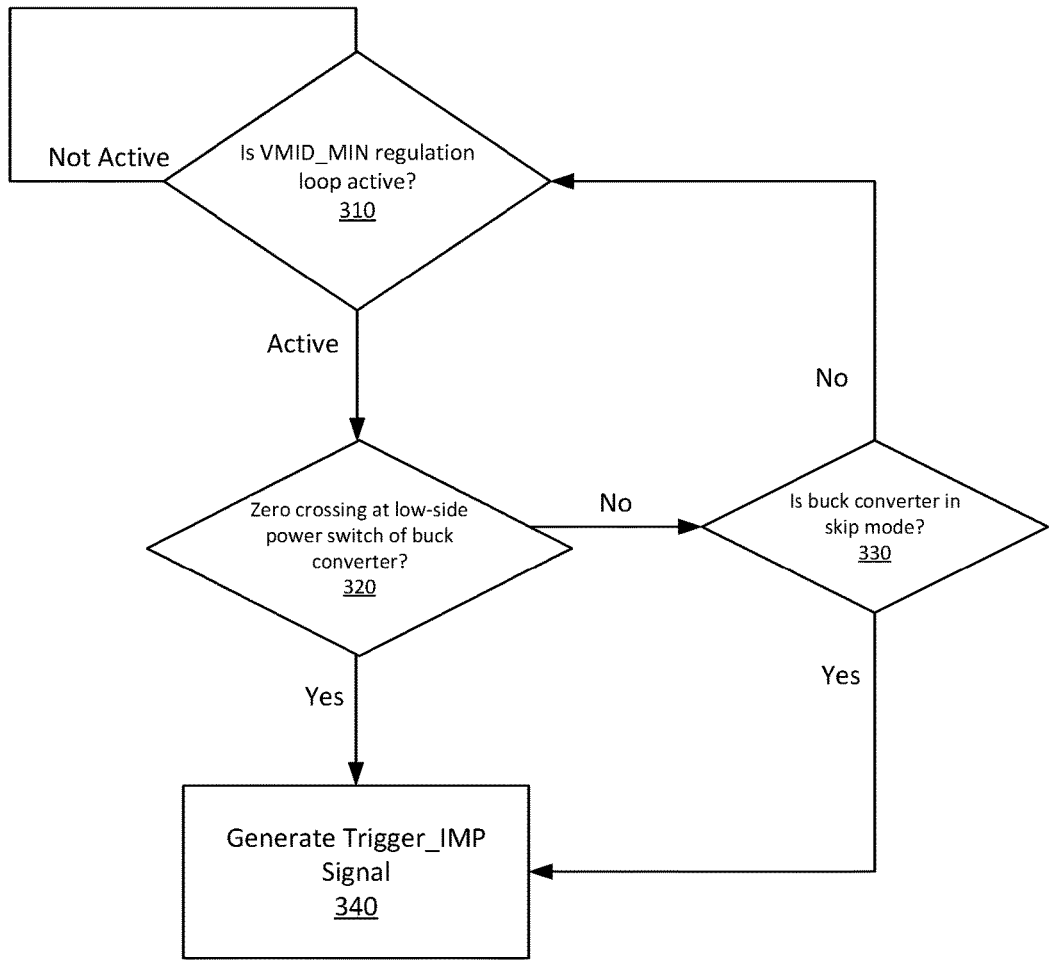
FIG. 3 shows a flow diagram of one implementation of a process to detect reverse boosting.

To further illustrate the technique to detect reverse boosting of buck converters in wireless charging schemes, FIG. 3 shows a flow diagram of one implementation of a process to detect reverse boosting. The process in FIG. 3 begins at block 310, in which a VMID_MIN regulation loop (e.g., VMID_MIN regulation loop 240 in FIG. 2) is monitored to detect if the VMID_MIN regulation loop has become active. The VMID_MIN regulation loop becomes active when the VMID_MIN regulation loop starts regulating the input voltage. If the VMID_MIN regulation loop has become active, then the process transitions to block 320. Otherwise, the process remains in block 310. In block 320, it is determined if a low-side power switch current of the buck converter has fallen below zero or has crossed zero. If zero crossing has occurred at the low-side power switch, then the process transitions to block 340. Otherwise, the process transitions to block 330.

At block 330, it is determined whether the buck converter has entered skip mode. In some implementations, the buck converter has entered skip mode if $V_{comp}$ drops below a predetermined threshold (e.g., 100 mV, 200 mV, etc.). If the buck converter has not entered skip mode, then the process returns to block 310. Otherwise, the process transitions to block 340.

At block 340, a Trigger_IMP signal is sent to a digital core of a PMIC to initiate the IMP algorithm to stop reverse boosting of the buck converter so that the battery is not unnecessarily discharged. In other words, Trigger_IMP is sent to the digital core to indicate that the power source is de-coupled (e.g., the power source has been turned off, the power source or the wirelessly chargeable device has been moved away from the power source, etc.). One of skill in the art should appreciate that the process illustrated in FIG. 3 can be implemented by hardware, software, firmware, or a combination of any of the above. One example of a hardware implementation of the above process is illustrated in FIG. 4.

Figure 4:
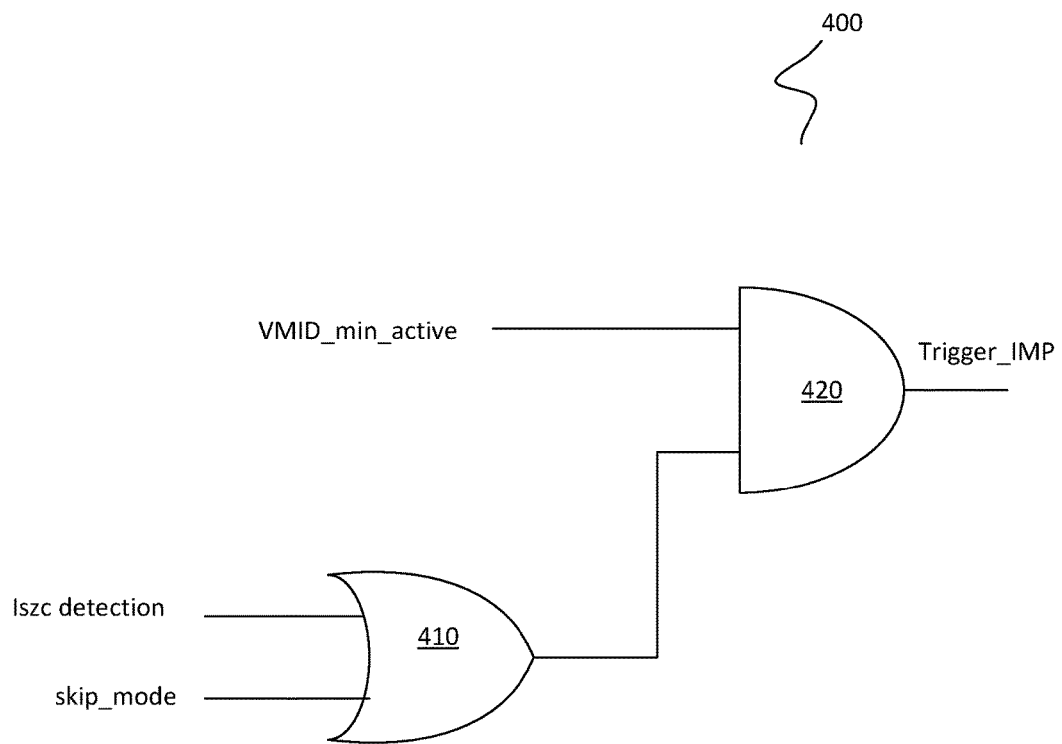
FIG. 4 illustrates one implementation of an IMP trigger signal generator.

FIG. 4 illustrates one implementation of an IMP trigger signal generator in a wirelessly chargeable portable device. The IMP trigger signal generator 400 includes an OR gate 410 and an AND gate 420. A first input of OR gate 410 receives Iszc detection signal, such as the Iszc detection signal generated by zero crossing detector 250 in FIG. 2. A second input of OR gate 410 receives a skip_mode signal, such as the skip_mode signal output by skip mode comparator 245 in FIG. 2. An output of OR gate 410 is coupled to a first input of AND gate 420. A second input of AND gate 420 receives a VMID_MIN_active signal, such as the VMID_MIN_active signal output by status comparator 243 of VMID_MIN regulation loop 240 in FIG. 2. AND gate 420 outputs the IMP trigger signal, Trigger_IMP, which can be sent to a digital core of a PMIC to initiate or trigger the IMP algorithm to stop reverse boosting of a buck converter (such as buck converter 210 in FIG. 2).

Figure 5:
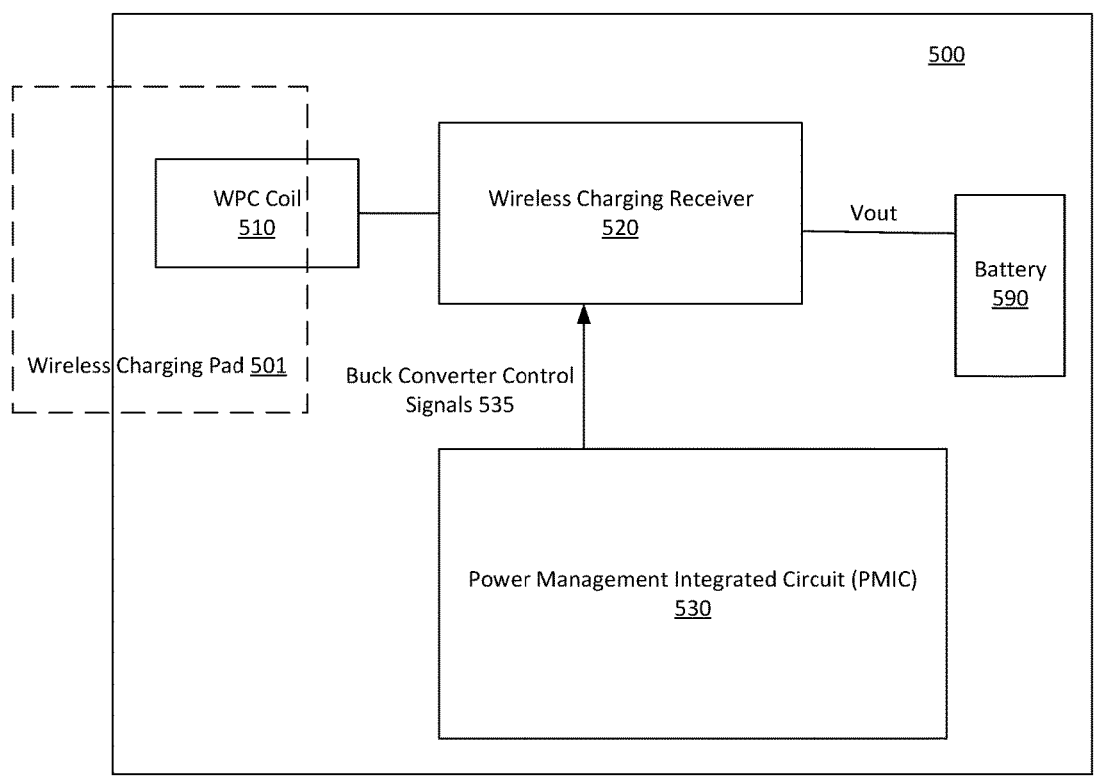
FIG. 5 illustrates one implementation of a portable device.

FIG. 5 illustrates one implementation of a portable device in which the above wireless charging scheme can be used. Some examples of portable device 500 include a smartphone, a smart watch, a laptop, etc. As shown in FIG. 5, portable device 500 includes a wireless power charging coil 510, a wireless charging receiver 520, a PMIC 530, and a battery 590. One should appreciate that portable device 500 can include additional components not illustrated in FIG. 5, such as a central processing unit (CPU), a display controller, a display, a memory, etc.

Referring to FIG. 5, wireless power charging coil 510 can be wirelessly coupled to a wireless charging pad 501 (or other wireless power source) to inductively receive power from wireless charging pad 501. Wireless power charging coil 510 is coupled to wireless charging receiver 520. Wireless charging receiver 520 may include, for example, a rectifier (e.g., rectifier 203 in FIG. 2) and a buck converter (e.g., buck converter 210 in FIG. 2). Wireless charging receiver 520 may comply with one or more wireless charging standards, such as Qi, PMA, etc.

In some implementations, wireless charging receiver 520 is further coupled to a PMIC 530 and a battery 590. Wireless charging receiver 520 can generate an output voltage to charge battery 590. PMIC 530 can include circuitries to manage various power related functions of portable device 500. For example, the PMIC 530 can include main error amplifier 230, PWM comparator 225, VMID_MIN regulation loop 240, SR latch 223, buck driver 221, and zero crossing detector 250 shown in FIG. 2. PMIC 530 can generate buck converter control signals 535 to control or drive the buck converter within wireless charging receiver 520. Furthermore, signals generated internal to PMIC 530 can be used for detecting reverse boosting in the buck converter of wireless charging receiver 520. Details of various implementations of such reverse boosting detection have been discussed above.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:
1. A charging scheme, comprising:
   a first loop to regulate an input voltage from a wirelessly coupled power source when a mid-level of the input voltage falls below a predetermined threshold, the input voltage being provided to a buck converter within a wireless charging receiver;
   a signal generator to generate a first signal if the first loop starts regulating the input voltage and the buck converter has entered a discontinuous mode; and a zero crossing detector to monitor if a current through a low side power transistor within the buck converter has fallen below zero.

2. The charging scheme of claim 1, wherein the buck converter has entered the discontinuous mode if the current through the low side power transistor has fallen below zero.

3. The charging scheme of claim 1, further comprising:
a comparator to generate a second signal indicative of the buck converter being in a skip mode.

4. The charging scheme of claim 3, wherein the buck converter has entered the discontinuous mode if the second signal is asserted.

5. The charging scheme of claim 1, wherein the input voltage is received via a wireless power coil inductively coupled to a wireless charging pad.

6. The charging scheme of claim 1, wherein the first loop is a minimum mid-level input voltage regulation (VMID_MIN regulation) loop.

7. The charging scheme of claim 1, wherein the first signal is an input missing poller (IMP) signal to indicate that the power source has been de-coupled.

8. A method, comprising:
determining if a first loop within a power management integrated circuit (PMIC) is active, wherein the PMIC is configured to control a wireless charging receiver and the first loop is configured to regulate an input voltage from a wirelessly coupled power source when a mid-level of the input voltage falls below a predetermined threshold;
if the first loop has begun regulating the input voltage, determining if a buck converter within the wireless charging receiver is in a discontinuous mode by detecting if a current through a low side power transistor of the buck converter has fallen below zero; and
generating a first signal to trigger an input missing poller mechanism if the first loop has begun regulating the input voltage and the buck converter is in the discontinuous mode.

9. The method of claim 8, wherein determining if the buck converter within the wireless charging receiver is in the discontinuous mode further comprises:
detecting if an output voltage of the first loop falls below a skip mode reference voltage.

10. The method of claim 8, further comprising:
inductively coupling to a power source to wirelessly receive power from the power source.

11. A portable device, comprising:
a wireless charging receiver comprising a buck converter; and
a power management integrated circuit (PMIC) coupled to the wireless charging receiver, the PMIC comprising a buck converter controller, the buck converter controller having a charging scheme, the charging scheme comprising
a first loop to regulate an input voltage from a wirelessly coupled power source when a mid-level of the input voltage falls below a predetermined threshold, the input voltage being provided to the buck converter;
a signal generator to generate a first signal if the first loop has begun regulating the input voltage and the buck converter has entered a discontinuous mode; and
a low side power transistor current zero crossing detector to monitor if a current through a low side power transistor within the buck converter has fallen below zero.

12. The portable device of claim 11, wherein the buck converter has entered the discontinuous mode if the current through the low side power transistor within the buck converter has fallen below zero.

13. The portable device of claim 11, further comprising:
a comparator to generate a second signal indicative of the buck converter being in a skip mode.

14. The portable device of claim 13, wherein the buck converter has entered the discontinuous mode if the second signal is asserted.

15. The portable device of claim 11, further comprising:
a wireless power coil configured to inductively couple to a wireless charging pad to receive the input voltage wirelessly.

16. The portable device of claim 11, wherein the first loop is a minimum mid-level input voltage regulation (VMID_MIN regulation) loop.

17. The portable device of claim 11, wherein the first signal is an input missing poller (IMP) signal to indicate that the power source has been de-coupled.

* * * * *